United States Patent
Yu et al.

[11] Patent Number: 5,958,800
[45] Date of Patent: Sep. 28, 1999

[54] METHOD FOR POST PLANARIZATION METAL PHOTOLITHOGRAPHY

[75] Inventors: Chen-Hua Yu; Syun-Ming Jang, both of Hsin-Chu, Taiwan

[73] Assignee: Taiwan Semiconductor Manufacturing Company, Ltd., Hsin-Chu, Taiwan

[21] Appl. No.: 09/282,663

[22] Filed: Mar. 31, 1999

Related U.S. Application Data

[63] Continuation-in-part of application No. 08/729,735, Oct. 7, 1996, abandoned.

[51] Int. Cl.$^6$ .............................. C03C 15/02; G03F 9/00; G03C 5/00
[52] U.S. Cl. ........................... 438/720; 438/633; 438/638; 438/639; 438/669; 438/692; 438/723; 438/737; 438/743; 438/763; 438/778; 438/975; 430/22; 430/314; 430/317; 430/318; 216/38; 216/39; 216/75; 216/80; 216/89
[58] Field of Search .................................. 438/401, 462, 438/633, 638, 639, 669, 692, 720, 723, 737, 743, 763, 778, 975; 430/22, 314, 317, 318; 216/38, 39, 75, 80, 89

[56] References Cited

U.S. PATENT DOCUMENTS

| | | |
|---|---|---|
| 5,393,233 | 2/1995 | Hong et al. ............................ 438/289 |
| 5,401,691 | 3/1995 | Caldwell ................................ 438/633 |
| 5,456,756 | 10/1995 | Ramaswami et al. ................. 118/721 |
| 5,503,962 | 4/1996 | Caldwell ................................ 430/317 |
| 5,635,337 | 6/1997 | Bartha et al. ......................... 430/323 |
| 5,741,626 | 4/1998 | Jain et al. .............................. 430/314 |

*Primary Examiner*—Bernard Codd
*Attorney, Agent, or Firm*—George O. Saile; Stephen B. Ackerman; William J. Stoffel

[57] ABSTRACT

A method of removing a planarized insulating layer from over an alignment mark on a wafer. The invention allows steppers to see alignment marks without the difficulty of viewing the alignment marks through the insulating layer overlying the alignment marks. The method begins by chemical mechanical polishing a conformal oxide layer over a substrate. Next, a first photoresist layer is formed over the conformal oxide layer. Then vias are etched in the conformal oxide layer in the device area and etch the conformal oxide layer in the alignment mark area. Subsequently, we form a second photoresist layer over the first photoresist layer and the conformal oxide layer. The second photoresist layer filling the vias, but not the alignment mark resist opening. Then etch the second photoresist layer leaving sidewall spacers on the sidewall of the first photoresist layer in the alignment mark area and leaving photoresist plugs filling the vias. Next, anisotropically etch the conformal oxide layer in the alignment mark area exposing the alignment mark patterns. Then, a metal layer is formed over the surface. The metal layer is patterned.

20 Claims, 5 Drawing Sheets

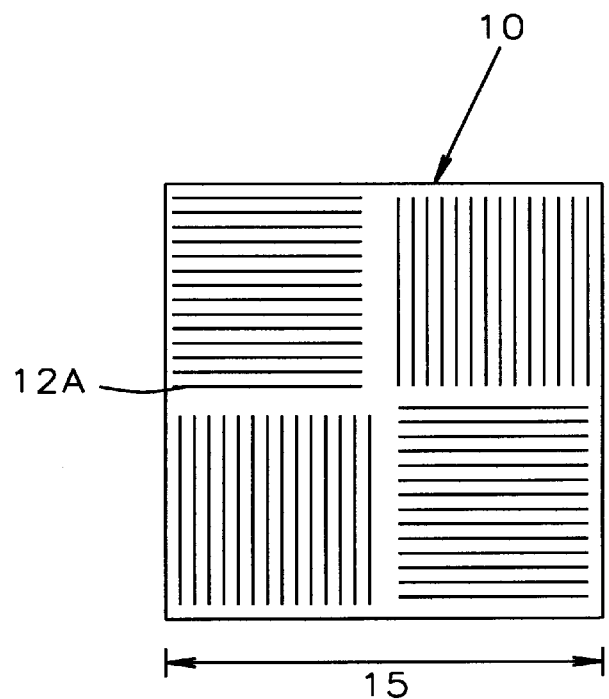
FIG. 1 – Prior Art
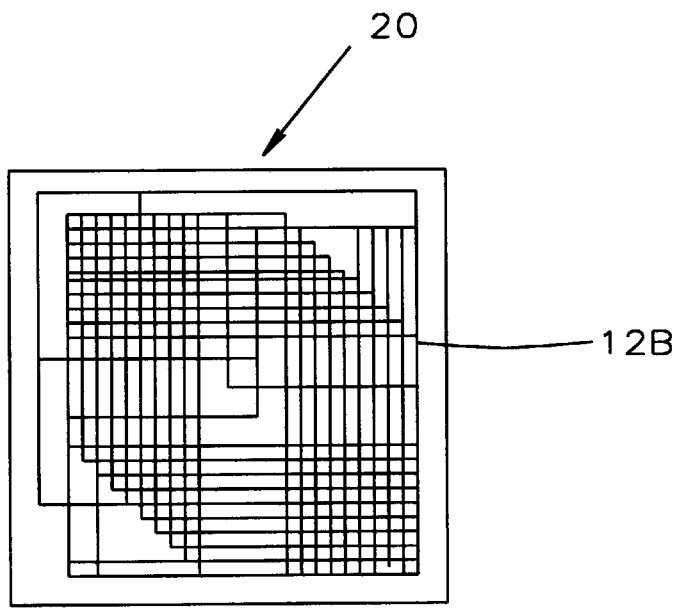
FIG. 2A – Prior Art

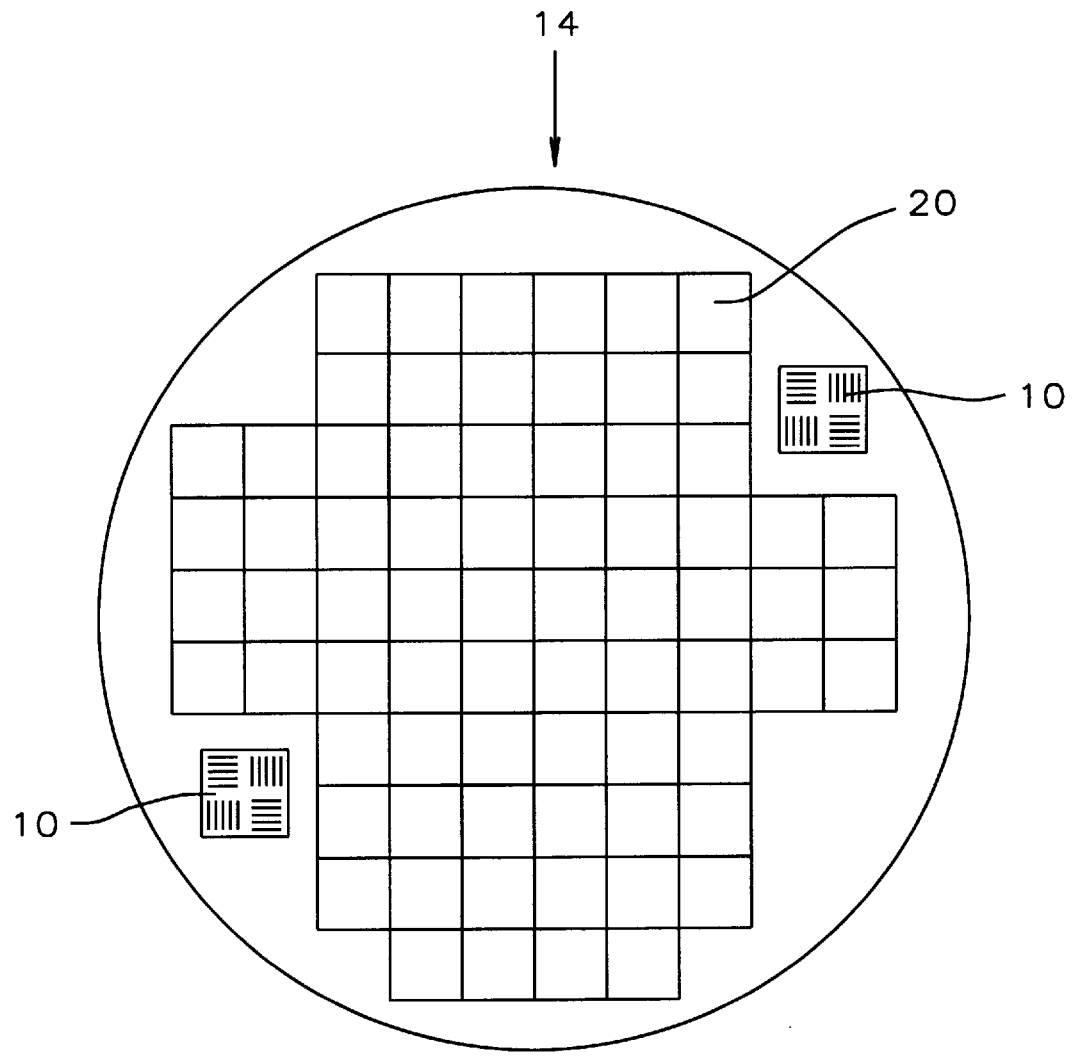
FIG. 2B - Prior Art

METHOD FOR POST PLANARIZATION METAL PHOTOLITHOGRAPHY

This application is a continuation-in-part of Ser. No. 08/729,735, filed Oct. 7, 1996, now abandoned.

BACKGROUND OF INVENTION

1) Field of the Invention

This invention relates generally to a process of planarizing insulating layers in semiconductor devices and more particularly to a process for removing planarized insulating layers over alignment mark areas.

2) Description of the Prior Art

Photolithography and planarization processes are two very important processes in the manufacture of advanced semiconductor devices. One photolithography tool used extensively is a stepper, such as an ASM lithography stepper. A stepper projects an image on a wafer to expose a photoresist pattern. The image size is only a portion of the substrate, such as the size of an individual chip. The stepper must move the image from chip to chip on the substrate to expose all of the chips. Steppers have automated alignment systems that use alignment marks on the substrate to align to for each exposure.

A substrate contains both alignment mark areas and device areas. FIG. 2B shows an alignment mark area 10 and device areas 20 (chip areas, product areas) on a wafer 14. FIG. 1 shows an example of an alignment mark area 10 on a substrate which has an alignment mark patterns 12A. The alignment mark patterns in the alignment mark area 20 are formed of a pattern of lines 12A. The alignment marks are often formed by etching patterns in to the silicon substrate. The alignment marks 12B are positioned strategically around the wafer and used by the stepper machines to align to various parts of the wafer. Also, FIG. 2A shows a top down view of device area 20 having conductive lines 12B.

Another key process in semiconductor manufacturing is planarization. Planarization is the smoothing or leveling of a surface, typically a surface of an insulating layer. Many insulating layers at least partially follow the topography of the underlying layers. The planarization process shapes the insulating layer back to a flat planar level. This level layer improves yields by improving photo processes and metal structures (layers) formed over the smooth planarized layer.

Planarization can be performed by several different methods, such as chemical mechanical polishing (CMP), spin-on-glass (SOG) or photoresist etchback. Chemical mechanical polishing is becoming more popular as it is a controllable process that produces an uniform level layer.

The inventors have experienced a problem when using the planarization process with insulating layers over alignment mark areas. Steppers have not been able to identify the alignment marks in alignment mark areas where the insulating layer over the alignment marks have been planarized especially using a chemical mechanical polish processes.

Therefore, there is a need to develop a process to planarize insulating layers over alignment mark areas so that the stepper can recognize/read the alignment marks.

Workers in the art have worked extensively with planarization processes. U.S. Pat. No. 5,393,233 (Hong) teaches a double poly process for forming a buried bit line ROM. The patent shows a typical planarization by chemical-mechanical polishing (CMP) to achieve a self aligned double poly word line structure. U.S. Pat. No. 5,456,756 (Chan et al.) teaches a clamp that prevents metal from depositing over alignment mark areas. However, the patent does not address the problem of viewing the alignment marks through subsequent overlying planarized layers.

SUMMARY OF THE INVENTION

It is an object of the present invention to provide a method for making alignment marks visible so that steppers and other tools can recognize alignment marks.

It is an object of the present invention to provide a method for removing the insulating layers over alignment mark areas so that the alignment marks can be accurately recognized/read.

It is another object of the present invention to provide a method for removing the planarized insulating layers (e.g., oxide layers) over alignment mark areas after vias are etched in the insulating layers so that the alignment marks can be read.

In brief, to accomplish the above objectives, the present invention provides a method of forming a planarized insulating layer, removing a portion of the insulating layer over an alignment mark area, removing all the insulating layer over the alignment mark area during a via etch, forming a metal layer over the insulating layer and patterning the metal layer using a stepper which aligns to the now visible alignment marks. The invention allows steppers and other tools to see alignment marks without the difficulty of viewing the alignment marks through the insulating layer overlying the alignment marks.

In slightly more detail, a preferred embodiment of the invention is a method of removing an insulating layer from over an alignment mark area on the substrate. The method begins by providing a semiconductor structure with a device area and an alignment mark area, the alignment mark area containing alignment mark patterns over the substrate; the device area having conductive lines over the substrate surface. Next, form a conformal insulating layer over the semiconductor structure surface. Then, planarize the conformal insulating layer. Then we form a first photoresist layer over the conformal insulating layer. The first photoresist layer having via openings over the conductive lines in the device area and an alignment mark resist opening over the alignment mark area. Then etch vias in the conformal insulating layer in the device area and etching alignment mark openings the conformal insulating layer in the alignment mark area. The alignment mark opening has a large diameter than the vias. Next, form a second photoresist layer over the first photoresist layer and the conformal oxide layer. The second photoresist layer filling the vias, and covering the conformal insulating layer in the alignment mark opening. Etch the second photoresist layer leaving sidewall spacers on the sidewall of the first photoresist layer in the alignment mark area and leaving photoresist plugs filling the vias. Etching the conformal insulating layer in the alignment mark area exposing the alignment mark patterns. Remove the first photoresist layer and the second photoresist layer exposing the alignment mark patterns and the conductive lines under the vias.

The method of the instant invention effectively removes the insulating layer over alignment marks after a planarization processes so that the alignment marks can be read by steppers or other devices. The method fully etches back (removes) the planarized insulating layer over an alignment mark while protecting the vias in device area from overetching. The method is effective, low cost and simple to implement.

BRIEF DESCRIPTION OF THE DRAWINGS

The features and advantages of the method for providing visible alignment marks after insulating layer planarization according to the present invention and further details such method in accordance with the present invention will be more clearly understood from the following description taken in conjunction with the accompanying drawings in which like reference numerals designate similar or corresponding elements, regions and portions and in which:

FIGS. 1 and 2A are top down views of alignment mark and device areas according to the prior art.

FIG. 2B is a top down view of a wafer having alignment mark areas 10 and device areas 20.

DETAILED DESCRIPTION OF THE PREFERRED EMBODIMENTS

Figure 3:
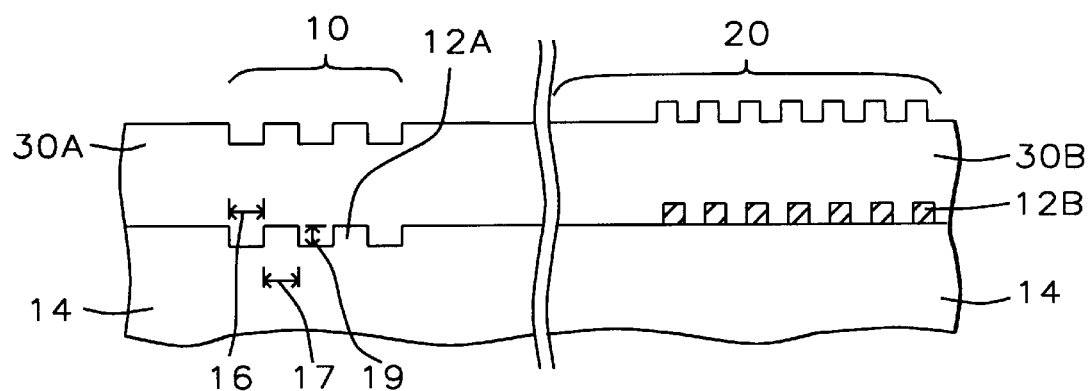
FIGS. 3, 4, 5, 6A, 6B, 7, 8, 9, and 10 are cross sectional views of a substrate having an alignment mark area and a device area illustrating an embodiment of the method of the present invention.

The present invention will be described in detail with reference to the accompanying drawings. The invention provides a process which provides visible alignment mark which are used in subsequent photolithography steps. In summary, as shown in FIGS. 3 through 10, the present invention provides a method of forming a planarized insulating layer 32, removing a portion of the insulating layer 32A over an alignment mark 12A, completely removing the remaining insulating layer over the alignment mark area during a via etch, forming a metal layer 60 over the insulating layer 32A and patterning the metal layer 60 using a stepper which aligns to the now visible alignment marks 12A. The invention allows steppers and other tools to see alignment marks without the difficulty of viewing the alignment marks through the insulating layer overlying the alignment marks.

Overview Of A Preferred Embodiment Of The Invention

A preferred embodiment of the method comprises: providing a substrate 14 with a device area 20 and an alignment mark area 10; the alignment mark area 10 containing alignment mark patterns 12A over the substrate; the device area 20 having raised lines 12B over the substrate surface;

a) forming a conformal insulating layer oxide layer 30A 30B over the substrate surface;

b) (See FIG. 4) chemical mechanical polishing the conformal oxide layer, 30A 30B insulating layer the remaining conformal oxide layer 32A 32B is thicker over the alignment mark area 10 than over the device area 20;

c) (See FIG. 5) forming a first photoresist layer 40 over the conformal oxide layer 32A 32B, the first photoresist layer 40 having via openings 42 over the conductive lines 12B in the device area 20 and an opening 41 over the alignment mark area 10;

d) anisotropically etching vias 42 in the conformal oxide layer 32B in the device area 20 and etching the conformal oxide layer 32A in the alignment mark area 10;

e) (See FIG. 6A) forming a second photoresist layer 50A 50B over the first photoresist layer 40 and the conformal oxide layer, 32A 32B the second photoresist layer 50A 50B filling the vias 42, and covering the conformal oxide layer in the opening; 41, f) (See FIG. 6B) etching the second photoresist layer leaving sidewall spacers 50A on the sidewall of the first photoresist layer 40A in the alignment mark area 10 and leaving photoresist plugs 50B filling the vias 42;

g) (See FIG. 7) etching the conformal oxide layer 32A in the alignment mark area 10 exposing the alignment mark patterns 12A;

h) removing the first photoresist layer 40 and the second photoresist layer 50A 50B exposing the alignment mark pattern 12A and the conductive lines 12B under the vias 42, i) forming a metal layer 60 over the alignment mark patterns 12B and filling the vias 42;

j) (See FIG. 9) forming a third photoresist layer 64 over the metal layer 60, the third photoresist layer 64 having an second opening over the alignment mark area 10;

k) (See FIG. 10) etching the metal layer 60 using the third photoresist layer as a mask and removing the metal layer over the alignment marks; and l) removing the third photoresist layer 64.

Detailed Description Of The Preferred Embodiment

The method begins by providing a substrate (or semiconductor structure) 14 with at least a device area 20 and an alignment mark area 10. The preferred substrate is composed of a P-type single crystal silicon having a (100) crystallographic orientation. The substrate 14 most preferably has a planar surface in both the device areas 20 and the alignment mark area 10. See FIG. 3. The term "substrate" is meant to include devices formed within a semiconductor wafer and the layers overlying the wafer.

The semiconductor structure 14 can comprise a semiconductor wafer including devices (e.g., source/drain regions) and layers (e.g., insulating and conducting) formed in and on the wafer. The semiconductor structure 14 is a product of processes. The semiconductor structure substrate can further include a dielectric layers and conductive layers (not shown, but underlies the conductive lines 12B and alignment marks 12A) composed of silicon oxide or silicon nitride.

The semiconductor structure 14 has a device area 20 and an alignment mark area 10. The semiconductor structure can include several insulating and conductive layer formed on a wafer. For example, in FIGS. 3 through 10, conductive lines 12B can be formed over a top insulating layer formed over a semiconductor wafer. Moreover, the device area 20 and alignment mark area 10 do not have to have the same overlying layers/devices.

The alignment mark area 10 preferably has a length and a width 15 (FIG. 1) in the range of between about 380 and 460 μm and more preferably about 420 μm.

As shown in FIGS. 1 and 3, the alignment mark area 10 contains alignment mark patterns 12A over the substrate. The device area 20 has conductive lines 12B over the wafer surface. Additional layers (not shown) can be formed in the device area. These layers can include insulating layers and conductive layers. The conductive lines 12B can be metal or the polysilicon lines. The conductive lines 12B are not necessarily on the same level (height) as the alignment mark pattern 12A.

The alignment patterns 12A are preferably etched into the silicon substrate surface. The alignment mark patterns 12A have a height 19 in the range of between about 1100 Å and 1300 Å and a height more preferably of about 1200 Å. The alignment marks have two preferred widths of about 8 μm and 10 μm. That is the alignment mark pattern 12A has a raised portion width 17 and a trench width 16 in the range of between about 7 and 9 μm and more preferably about 8.0 μm. Also, the alignment mark pattern 12A has a raised portion width 17 and a trench width 16 in the range of between about 9 and 11 μm and more preferably about 10.0 μm.

The conductive lines and alignment marks can be formed from the first layer of conductive structures, such as source/drains, resistors, etc. and of the layers overlying the first level structures. These layers include metal lines, such as tungsten (W), aluminum (Al), tungsten silicide ($WSi_x$), titanium nitride (TiN), titanium (Ti), aluminum cooper alloy (AlCu, AlSiCu) etc.

Still referring to FIG. 3, a conformal insulating layer 30A 30B is formed over the substrate surface including both the alignment mark area 10 and the device area 20. The conformal insulating layer 30A 30B is preferably formed of silicon oxide and preferably has a thickness in the range of between about 20,000 and 25,000 Å and more preferably about 22,000 Å (before chemical-mechanical polishing (CMP)). The conformal insulating layer 30A 30B is more preferably formed of silicon oxide.

Figure 4:
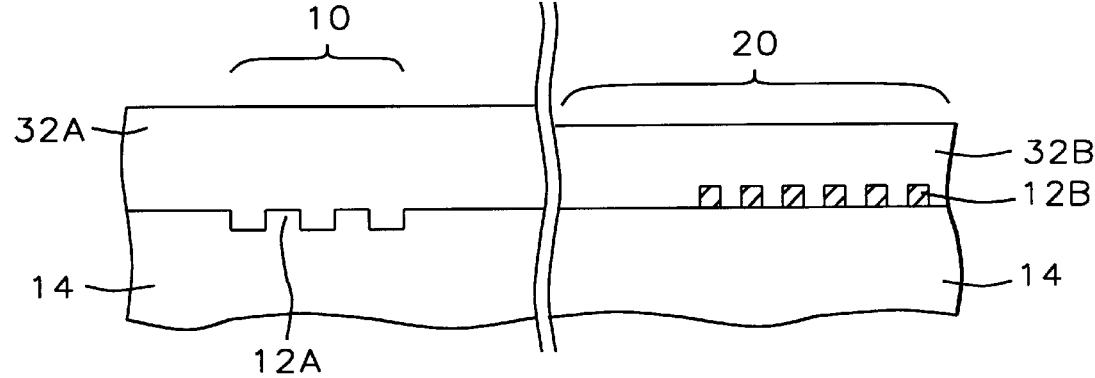

As shown in FIG. 4, the conformal insulating layer 30A 30B is then planarized. The planarization can be performed by chemical mechanical polishing, spin-on-glass (SOG) or Photoresist etchback. Preferably the planarization is a chemical mechanical polish process. The CMP planarization tends to remove more oxide 32B from over the device area than over the alignment mark area 10. Therefore, as shown in FIG. 4, the remaining conformal oxide layer 32A 32B is thicker over the alignment mark area 10 than in the device area 20. The lines 12B tend to be more closely spaced than the alignment marks 12A therefore the insulating layer over device area 20 tends to polish faster than over the alignment mark area. Therefore after the chemical-mechanical polish, the insulating layer 40A over the alignment mark area 10 is thicker than over the device area 20.

The planarization of the conformal insulating layer 32A 32B is preferably performed by chemical mechanical polishing the conformal insulating layer 32A 32B. Chemical mechanical polishing (CMP) involves polishing the top surface of the wafer with a slurry. An example slurry would be the SCI slurry, available from Rodel Products Corporation of Newark, Del. USA. Such slurry comprises KOH, $SiO_2$ particles and water. A typical CMP polish time would be from about 1 to 2 minutes. Any residual slurry left on the wafer surface would be removed by a conventional wet cleaning technique.

However, experiments show that the planarization process does not remove an even amount of insulating layer 30 over the alignment mark areas 10 and the device areas 20. As shown in FIG. 2B, the alignment marks areas 10 are normally located in open (not patterned) areas of the wafer. This causes the alignment mark area to polish slower than the device areas which have a more irregular surface. Because the top surface of the insulating layer 30A 30B has more valleys and less peaks than the alignment marks area 10 than in the device areas 20, the planarization process leaves a thicker oxide layer 32A 32B over in the alignment mark area than in the device area 20. For example, the conformal insulating layer 32A 32B has a thickness, after the chemical mechanical polishing step, in the alignment mark area 10 in the range of between about 11,000 and 16,000 Å and a thickness, after the chemical mechanical polishing step, in the device area 20 in the range of between about 8000 and 12,000 Å.

The thicker insulating layer 30A 30B thickness in the alignment mark area 32A causes problems with the stepper reading/recognition of the alignment marks 12A. In a subsequent via etch step, not all the insulating layer 32A (e.g., oxide) in the alignment mark area 10 over the alignment marks 12A is removed. See FIG. 5. The remaining oxide (insulating layer 30 over the alignment mark) prevents the stepper tool from viewing the alignment mark 12A.

Figure 5:
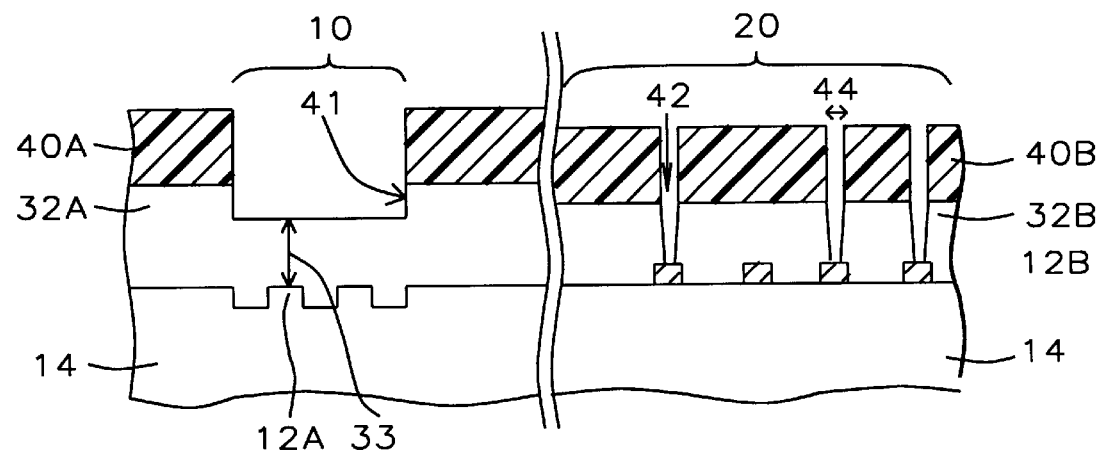

As shown in FIG. 5, a first photoresist layer 40 (40A 40B) (or via photoresist layer) is then formed over the conformal oxide layer 32A 32B. The first photoresist layer 40A 40B is one resist layer. Resist section 40A is shown defining an alignment mark opening 41 and resist section 40B defining vias 42. The first (via) photoresist layer 40 has via openings 42 over the conductive lines 12B in the device area 20 and an alignment mark opening 41 over the over the alignment mark patterns 12A in the alignment mark area 10. The first photoresist layer preferably has a having a thickness in the range of between about 8000 and 12,000 Å and more preferably about 10,000 Å.

Still referring to FIG. 5, vias 42 are etched in the conformal oxide layer 32B over the device area 20 using the first photoresist layer 40B as a mask. At the same time, the conformal oxide layer 32A in the alignment mark area 10 is etched using the first photoresist layer 40A as a mask. The oxide layer 32A is thicker than the oxide layer 32B in the device areas. The vias 42 preferably have a diameter 44 in the range of between about 0.35 and 0.5 $\mu$m and more preferably about 0.4 $\mu$m. The thickness 33 of the remaining insulating layer 32A over the alignment marks is in the range of between about 0 and 4000 Å.

Figure 6A:
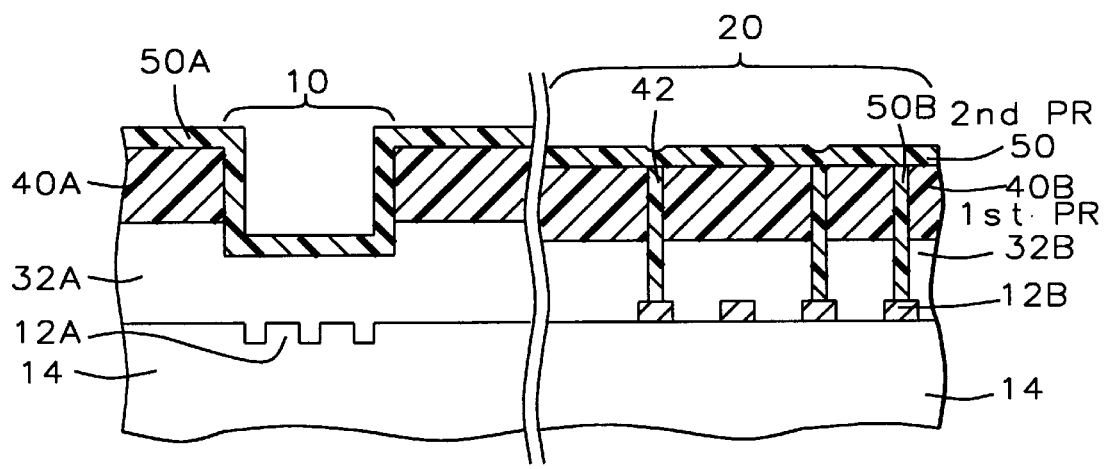

As shown in FIG. 6A, a second photoresist layer 50A 50B is formed over the first photoresist layer 40A 40B and the conformal oxide layer 32A 32B. The second photoresist layer 50A 50B fills the vias 42 as shown in FIG. 6A. The resist has a thickness that allows resist to fill the vias 42 but not fill the alignment mark opening 41. The second photoresist layer 50 (50A 50B) preferably has a thickness in the range of between about 1000 and 3000 Å.

Figure 6B:
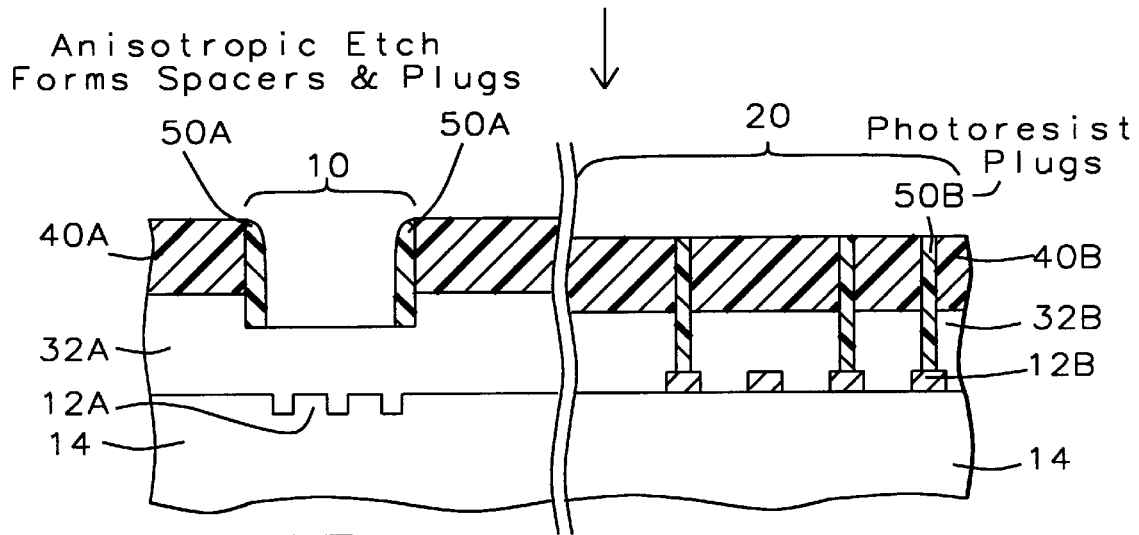

As shown in FIG. 6B, the second photoresist layer is anisotropically etched leaving sidewall spacers 50A on the sidewall of the first (via) photoresist layer 40A in the alignment mark area 10 and leaving photoresist plugs 50B filling the vias 42. The photoresist plugs are formed in the vias 42 because the diameters 44 (e.g., open dimension) of the vias 42 are less than the twice the thickness of the second photoresist layer 50. Therefore the photoresist 50 forms on the sidewalls of the via hole 42 and totally fills the via forming a plug 50B. During the anisotropic etch of the second photoresist layer, only the thickness of the second photoresist layer 50 (the photoresist on top of the $1^{st}$ photoresist layer 40A) is removed thereby leaving the resist plug 50B filling the via 42 and forming resist spacers 50A on the sidewalls of the alignment mark opening 41.

The photoresist layer 50 is preferably anisotropically etched using $CF_4$. The second photoresist layer preferably has a thickness in the range of between about 1000 and 3000 Å and more preferably of about 2000 Å. Preferably, the $2^{nd}$ resist layer has a thickness greater than the radius of the vias 42 and less than the radius of the alignment mark opening 41. (The radius half of the diameters.)

Figure 7:
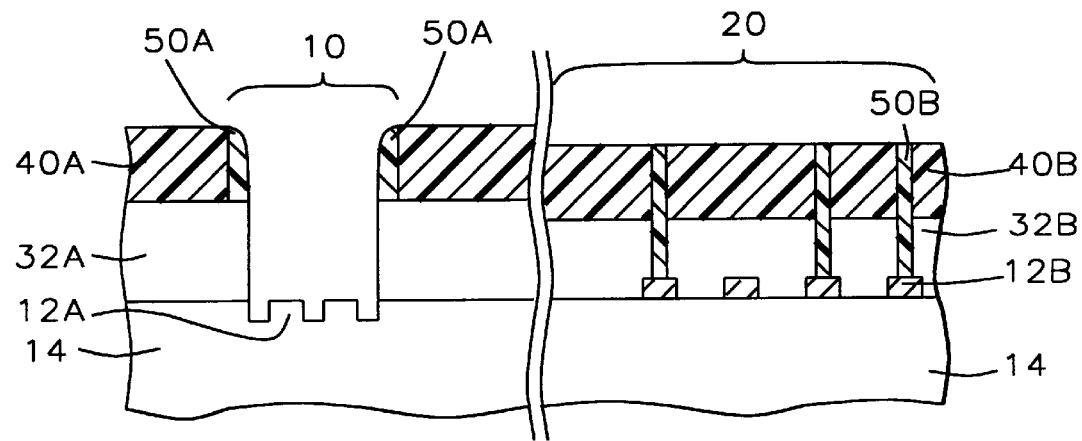

Referring to FIG. 7, the conformal oxide layer 32A in the alignment mark area 10 is etched thereby exposing the alignment mark patterns 12A. Preferably the etch is an anisotropic etch. The second photoresist layer 50B protects the vias 42 and insulating layer 32A 32B from this etch.

Figure 8:
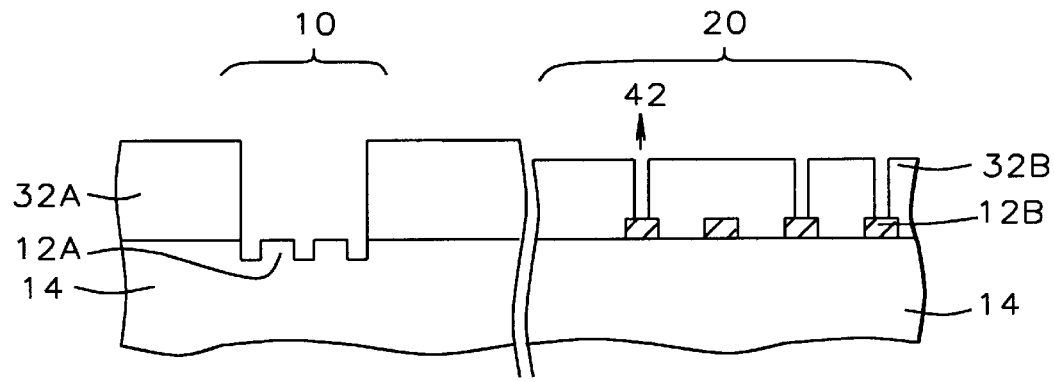

FIGS. 8 shows the step of removing the first photoresist layer (via photoresist layer) 40A 40B and the second photoresist layer 50A 50B exposing the alignment mark pattern 12A and said conductive lines 12B under the vias 42.

Figure 9:
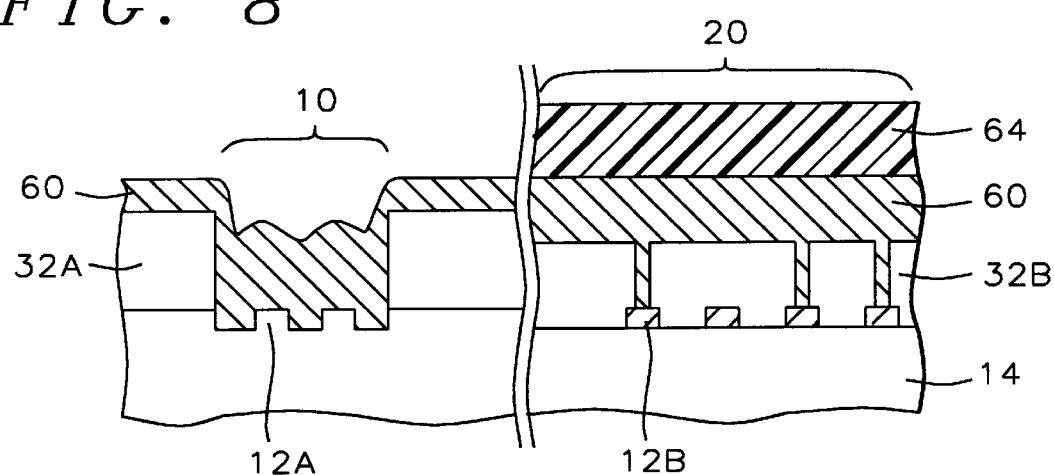

Turning to FIG. 9, a metal layer 60 is formed over the alignment mark patterns 1 2B and fills the vias 42. Metal layer 60 preferably is formed of an alloy of AlCu or AlSiCu material and is preferably formed of AlCu. The metal layer 60 preferably has a thickness in the range of between about 5000 and 7,500 Å and more preferably about 7000 Å.

In an second embodiment (e.g., optional process), the metal layer 60 can be removed from the alignment mark area 10. Sometimes the metal layer (large grain or rough surface) makes it difficult to read the alignment mark.

Still referring to FIG. 9, a third photoresist layer 64 is formed over the metal layer 60. The third photoresist layer is exposed preferably using a stepper, such as an ASM optical stepper. The stepper can recognize the alignment marks 12B because the insulating layer 32A does not overlie the alignment marks 12A. The optics of the stepper only have to look through (reflect off) the metal layer 60 to see the alignment mark 12A.

After the stepper exposes the third photoresist layer, the photoresist is developed and etched by conventional processes. The third photoresist layer 64 has an opening over the alignment mark area 10.

Figure 10:
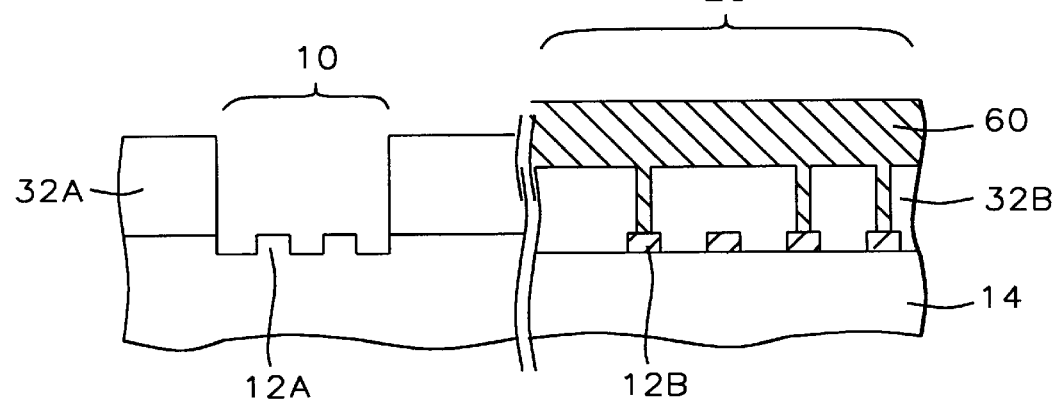

As shown in FIG. 10, the metal layer 60 is etched using the third photoresist layer 64 as a mask. The metal layer 60 over the alignment marks patterns 12B is removed. Lastly, the third photoresist layer 64 is removed.

The method of the instant invention effectively removes the insulating layer(s) over alignment marks 12A after planarization processes so that the alignment marks 12A can be read by steppers or other devices. The method fully etches back the planarized insulating layer 32A over an alignment mark 12A while protecting vias 42 in device areas 20 from overetching. The method is effective, low cost, and simple to implement. The invention also has an embodiment which removes metal layers and polysilicon 60 layers from over the alignment mark patterns 12B.

While the invention has been particularly shown and described with reference to the preferred embodiments thereof, it will be understood by those skilled in the art that various changes in form and details may be made without departing from the spirit and scope of the invention.

What is claimed is:

1. A method of removing an insulating layer from over an alignment mark area on said substrate, the method comprising:
  a) providing a semiconductor structure with a device area and an alignment mark area, said alignment mark area containing alignment mark patterns over said substrate; said device area having conductive lines over said substrate surface;
  b) forming a conformal insulating layer over the semiconductor structure surface;
  c) planarizing said conformal insulating layer;
  d) forming a first photoresist layer over said conformal insulating layer, said first photoresist layer having via openings over said conductive lines in said device area and an alignment mark resist opening over said alignment mark area;
  e) etching vias in said conformal insulating layer in said device area and etching alignment mark openings in said conformal insulating layer in said alignment mark area; said alignment mark opening has a larger diameter than said vias;
  f) forming a second photoresist layer over said first photoresist layer and said conformal oxide layer, said second photoresist layer filling said vias, and covering said conformal insulating layer in said alignment mark opening;
  g) etching said second photoresist layer leaving sidewall spacers on the sidewall of said first photoresist layer in said alignment mark area and leaving photoresist plugs filling said vias;
  h) etching said conformal insulating layer in said alignment mark area exposing said alignment mark patterns;
  i) removing said first photoresist layer and said second photoresist layer exposing said alignment mark patterns and said conductive lines under said vias.

2. The method of claim 1 which further includes:
  a) forming a metal layer over the said alignment mark patterns and covering said vias;
  b) forming a third photoresist layer over said metal layer, said third photoresist layer having a first opening over said alignment mark area;
  c) etching said metal layer using said third photoresist layer as a mask and removing said metal layer from over said alignment mark patterns; and
  d) removing said third photoresist layer.

3. The method of claim 1 which further includes:
  a) forming a metal layer over the said alignment mark patterns and covering said vias;
  b) forming a third photoresist layer over said metal layer, said third photoresist layer having a first opening over said alignment mark area; said first opening in said third photoresist layer is formed by exposing, developing and etching said third photoresist layer; said exposure performed by a stepper using said alignment mark patterns to align said stepper;
  c) etching said metal layer using said third photoresist layer as a mask and removing said metal layer from over said alignment mark patterns; and
  d) removing said third photoresist layer.

4. The method of claim 1 wherein step (c) comprises: chemical-mechanical polishing said conformal insulating layer, where the remaining conformal insulating layer is thicker over said alignment mark area than over said device area.

5. The method of claim 1 wherein said conductive lines are formed of a material selected from the group consisting of polysilicon, tungsten silicide, AlCu and AlSiCu.

6. The method of claim 1 wherein said alignment mark patterns have a height in the range of between about 1100 Å and 1300 Å and a width in the range of between about 7 and 11 µm.

7. The method of claim 1 wherein said alignment mark area has a length and a width in the range of between about 270 and 460 µm.

8. The method of claim 1 wherein said conformal insulating layer is formed of a material selected from the group consisting of silicon oxide and spin-on-glass, and has a thickness in the range of between about 20,000 and 25,000 Å.

9. The method of claim 1 wherein after the planarization of said conformal insulating layer, said conformal insulating layer has a thickness, in said alignment mark area in a range of between about 11,000 and 16,000 Å and a thickness in said device area in the range of between about 8000 and 12,000 Å.

10. The method of claim 1 wherein said vias have a diameter in the range of between about 0.35 and 0.5 µm.

11. The method of claim 1 wherein said second photoresist layer has a thickness in the range of between about 1000 and 3000 Å.

12. A method of forming a metal layer over a planarized insulating layer on a substrate and removing said insulating layer from an alignment mark area on said substrate, the method comprising:

a) providing a substrate with a device area and an alignment mark area said alignment mark area containing alignment mark patterns over said substrate, said device area having conductive lines over said substrate surface;

b) forming a conformal oxide layer over the substrate surface;

c) chemical mechanical polishing said conformal oxide layer, the remaining conformal oxide layer is thicker over said alignment mark area than over said device area;

d) forming a first photoresist layer over said conformal oxide layer said first photoresist layer having via openings over said conductive lines in said device area and an alignment mark resist opening over said alignment mark area; said alignment mark resist opening has a diameter larger than the diameters of said vias openings;

e) anisotropically etching vias in said conformal oxide layer in said device area and partially etching an alignment mark opening said conformal oxide layer in said alignment mark area;

f) forming a second photoresist layer over said first photoresist layer and said conformal oxide layer, said second photoresist layer filling said vias, and covering said conformal oxide layer in said alignment mark opening;

g) anisotropically etching said second photoresist layer leaving sidewall spacers on the sidewall of said first photoresist layer and said alignment mark opening in said alignment mark area and leaving photoresist plugs filling said vias;

h) etching said conformal oxide layer in said alignment mark area to form an alignment mark opening exposing said alignment mark patterns;

i) removing said first photoresist layer and said second photoresist layer exposing said alignment mark pattern and said conductive lines under said vias;

j) forming a metal layer over the said alignment mark patterns and filling said vias;

k) forming a third photoresist layer over said metal layer, said third photoresist layer having an opening over said alignment mark opening;

l) etching said metal layer using said third photoresist layer as a mask and removing said metal layer over said alignment marks; and m) removing said third photoresist layer.

13. The method of claim 12 where in said opening in said third photoresist layer is formed by exposing, developing and etching said third photoresist layer; said exposure performed by a stepper using said alignment mark patterns to align said stepper.

14. The method of claim 12 wherein said conductive lines are formed of a material selected from the group consisting of polysilicon, tungsten silicide, AlCu and AlSiCu.

15. The method of claim 12 wherein said alignment mark patterns have a height in the range of between about 1100 Å and 1300 Å and a width in the range of between about 7 and 11 μm.

16. The method of claim 12 wherein said alignment mark area has a length and a width in the range of between about 270 and 460 μm.

17. The method of claim 12 wherein said conformal insulating layer is formed of a material selected from the group consisting of silicon oxide and spin-on-glass, and has a thickness in the range of between about 20,000 and 25,000 Å.

18. The method of claim 12 wherein after the planarization of said conformal insulating layer, said conformal insulating layer has a thickness, in said alignment mark area in the range of between about 11,000 and 16,000 Å and a thickness in said device area in the range of between about 8000 and 12,000 Å.

19. The method of claim 12 wherein said vias have a diameter in the range of between about 0.35 and 0.5 μm.

20. The method of claim 12 wherein said second photoresist layer has a thickness in the range of between about 1000 and 3000 Å.

* * * * *